(12) United States Patent
Kashiwagi et al.

(10) Patent No.: US 8,294,342 B2
(45) Date of Patent: Oct. 23, 2012

(54) OPTICAL SHEET AND DISPLAY

(75) Inventors: Tsuyoshi Kashiwagi, Mihara (JP); Yousuke Ezaki, Nishisonogi-Gun (JP); Yukihiro Makita, Sakai (JP); Takayuki Niijima, Saitama (JP)

(73) Assignee: Dai Nippon Printing Co., Ltd., Shinjuku-Ku (JP)

( * ) Notice: Subject to any disclaimer, the term of this patent is extended or adjusted under 35 U.S.C. 154(b) by 163 days.

(21) Appl. No.: 12/518,133

(22) PCT Filed: Dec. 11, 2007

(86) PCT No.: PCT/JP2007/073862
§ 371 (c)(1),
(2), (4) Date: Jun. 8, 2009

(87) PCT Pub. No.: WO2008/072626
PCT Pub. Date: Jun. 19, 2008

(65) Prior Publication Data
US 2010/0103525 A1 Apr. 29, 2010

(30) Foreign Application Priority Data
Dec. 11, 2006 (JP) .................................. 2006-333589

(51) Int. Cl.
*H01J 5/16* (2006.01)
*H01J 61/40* (2006.01)
*H01K 1/26* (2006.01)
*H01K 1/30* (2006.01)

(52) U.S. Cl. ........ 313/112; 313/111; 313/581; 313/582; 313/586; 313/587; 359/601; 359/614; 359/831; 359/837

(58) Field of Classification Search .......... 313/581–587; 359/831–837, 601–614
See application file for complete search history.

(56) References Cited

U.S. PATENT DOCUMENTS

| | | | | |
|---|---|---|---|---|
| 6,995,907 | B2 * | 2/2006 | Osawa et al. | 359/460 |
| 7,050,227 | B2 * | 5/2006 | Olofson et al. | 359/443 |
| 7,679,275 | B2 * | 3/2010 | Park et al. | 313/112 |
| 7,696,678 | B2 * | 4/2010 | Park et al. | 313/112 |
| 7,755,263 | B2 * | 7/2010 | Park et al. | 313/112 |
| 2002/0012182 | A1 | 1/2002 | Ozawa | |
| 2004/0160186 | A1 | 8/2004 | Cho et al. | |
| 2004/0160669 | A1 * | 8/2004 | Osawa et al. | 359/460 |
| 2004/0239248 | A1 * | 12/2004 | Chang et al. | 313/582 |
| 2006/0145578 | A1 * | 7/2006 | Park et al. | 313/112 |
| 2006/0250064 | A1 * | 11/2006 | Park et al. | 313/112 |
| 2008/0012793 | A1 * | 1/2008 | Park et al. | 345/32 |
| 2009/0009899 | A1 | 1/2009 | Nakamura et al. | |

(Continued)

FOREIGN PATENT DOCUMENTS
JP 2002-097383 A1 4/2002
(Continued)

*Primary Examiner* — Nimeshkumar Patel
*Assistant Examiner* — Thomas A Hollweg
(74) *Attorney, Agent, or Firm* — Burr & Brown

(57) ABSTRACT

An optical sheet capable of enhancing contrast is provided. The optical sheet includes a layer configured to control light incident on the layer and then allow the light to exit towards the observer side. The optical sheet includes: an optical functional sheet layer having multiple prisms capable of transmitting light and multiple light-absorbing parts capable of absorbing light, the multiple prisms and multiple light-absorbing parts being arranged alternately along a sheet plane of the optical sheet; and an electromagnetic-wave shield layer. The electromagnetic-wave shield layer is positioned on a side opposite to the observer side relative to the optical functional sheet layer.

11 Claims, 15 Drawing Sheets

U.S. PATENT DOCUMENTS

2010/0103525 A1 * 4/2010 Kashiwagi et al. ........... 359/599

FOREIGN PATENT DOCUMENTS

| | | |
|---|---|---|
| JP | 2002-372617 A1 | 12/2002 |
| JP | 2005-514669 A1 | 5/2005 |
| JP | 2006-065185 A1 | 3/2006 |
| JP | 2006-084876 A1 | 3/2006 |
| JP | 2006-189867 A1 | 7/2006 |
| WO | 03/058669 A1 | 7/2003 |
| WO | 2006/088056 A1 | 8/2006 |

* cited by examiner

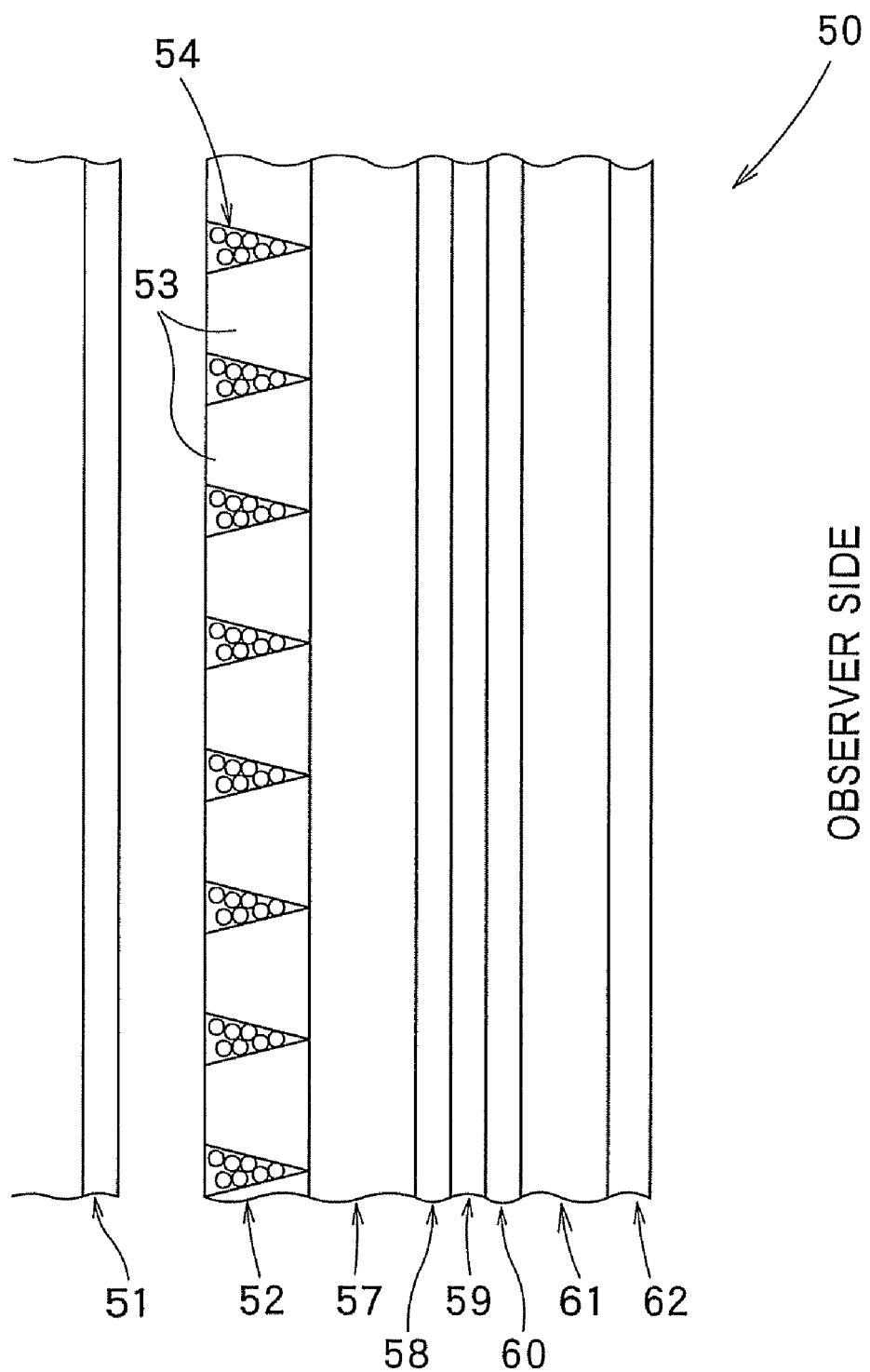
F I G. 7

OPTICAL SHEET AND DISPLAY

CROSS-REFERENCE TO RELATED APPLICATION

This application is based on the Japanese Patent Application No. 2006-333589 filed on Dec. 11, 2006. The whole contents of the Japanese Patent Application No. 2006-333589 are incorporated herein by reference.

FIELD OF THE INVENTION

The present invention relates to an optical sheet that is used in a display, such as a plasma television, in order to control incoming light properly and then allow the light to exit towards the observer side. The present invention also relates to a display comprising the optical sheet.

BACKGROUND OF THE INVENTION

In a display comprising a plasma display panel (hereinafter also referred to as "PDP"), such as a television (plasma television), an optical sheet (optical member, front filter) are situated on the observer side relative to a light source such as a PDP. The optical sheet has various functions and acts to control light from a source (image light source) so as to output clear and proper image light towards the observer side.

Such an optical sheet is made of a laminate of layers having different functions (features). For example, the optical sheet disclosed in Japanese Laid-Open Patent Publication No. 2006-189867 makes it possible to improve image light in transmittance (luminance) and in contrast (light-dark ratio).

Because of the recent strong demand for displays improved in fineness and performance, however, there is a need to enhance contrast more greatly than the conventional optical sheet described in Japanese Laid-Open Patent Publication No. 2006-189867 can achieve.

SUMMARY OF THE INVENTION

Accordingly, an object of the present invention is to provide an optical sheet capable of enhancing contrast.

An optical sheet (i.e., an optical laminate) according to the present invention that has a plurality of layers configured to control light incident on the plurality of layers and then allow the light to exit towards the an observer side and comprises: an optical functional sheet layer having multiple prisms capable of transmitting light and multiple light-absorbing parts capable of absorbing light, the multiple prisms and the multiple light-absorbing parts being arranged alternately along a sheet plane of the optical sheet; and an electromagnetic-wave shield layer having a function of shielding electromagnetic waves, the electromagnetic-wave shield layer being positioned on a side opposite to the observer side relative to the optical functional sheet layer.

The optical sheet according to the present invention may further comprise at least one layer selected from the group consisting of a film layer capable of shielding neon rays, a film layer capable of shielding infrared rays, a film layer capable of correcting color tone, and a film layer capable of preventing reflection of light.

In such an optical sheet according to the present invention, the at least one layer selected from the group consisting of a film layer capable of shielding neon rays, a film layer capable of shielding infrared rays, a film layer capable of correcting color tone, and a film layer capable of preventing reflection of light may be positioned in at least one of the following positions: on the observer side relative to both the optical functional sheet layer and the electromagnetic-wave shield layer; on the side opposite to the observer side relative to both the optical functional sheet layer and the electromagnetic-wave shield layer; and between the optical functional sheet layer and the electromagnetic-wave shield layer.

Alternatively, in the optical sheet according to the present invention, the film layer capable of preventing reflection of light may be positioned outermost on the observer side, and the optical functional sheet layer may be positioned next to the film layer capable of preventing reflection of light.

Alternatively, the optical sheet according to the present invention may further comprise a substrate layer positioned next to the optical functional sheet layer, wherein the film layer capable of preventing reflection of light may be positioned outermost on the observer side, and wherein the substrate layer may be positioned next to the film layer capable of preventing reflection of light.

Alternatively, in the optical sheet according to the present invention, the optical functional sheet layer may be positioned outermost on the observer side.

The optical sheet according to the present invention may further comprise a substrate layer positioned next to the optical functional sheet layer, wherein the substrate layer may be positioned outermost on the observer side.

The optical sheet according to the present invention may further comprise a base plate layer adhered directly or indirectly with the optical functional sheet layer, wherein only the electromagnetic-wave shield layer may be formed as a separate member from the base plate layer. The term "separate member (separate layer)" herein means that a member (layer) is not fixed either directly or indirectly to another object member (layer) with an adhesive. The "substrate layer" can be formed from a material having high light transmittance and required rigidity. Any material can be used for the substrate layer as long as it has high light transmittance and required rigidity, and, glass can be used, for example.

Furthermore, in the optical sheet according to the present invention, in a cross section taken along a normal to a light-exiting face of the optical sheet, each of the multiple prisms may be in a nearly trapezoidal shape with a lower base having a greater width and a upper base having a smaller width, the lower base being positioned on the observer side and the upper base being positioned on the side opposite to the observer side, and each of the light-absorbing parts may be in a nearly triangular shape with its base being positioned on the same side as the upper base of the nearly trapezoidal shape section of the each of the multiple prisms. In such an optical sheet according to the present invention, in the cross section taken along the normal to the light-exiting face of the optical sheet, an oblique line extending from one end of the base of the nearly triangular shape section of each of the light-absorbing parts may include such a curved line and/or a broken line that an angle between the oblique line and the normal to the light-exiting face of the optical sheet, determined at one side in a thickness direction of the optical sheet, is different from an angle between the oblique line and the normal to the light-exiting face of the optical sheet, determined at the other side in the thickness direction of the optical sheet. Alternatively, in the optical sheet according to the present invention, in the cross section taken along the normal to the light-exiting face of the optical sheet, an oblique line extending from one end of the base of the nearly triangular shape section of each of the light-absorbing parts may include such a broken line that an angle between the oblique line and the normal to the light-exiting face of the optical sheet, determined at one side in a thickness direction of the optical sheet, is different from an angle between the oblique line and the normal to the light-exiting face of the optical sheet, determined at the other side in the thickness direction of the optical sheet, and an angle between the oblique line and the normal to the light-exiting face of the optical sheet, determined at any point in the thickness direction of the optical sheet, may be more than zero and equal to or less than 10 degrees.

Furthermore, in the optical sheet according to the present invention, the prisms may be made from a resin with a refractive index of Np, and the light-absorbing parts may be made from a resin with a refractive index of Nb, and the refractive index Np may be equal to or greater than the refractive index Nb.

Furthermore, in the optical sheet according to the present invention, the light-absorbing parts may include light-absorbing particles with a mean particle diameter of 1 μm or more.

Furthermore, in the optical sheet according to the present invention, the electromagnetic-wave shield layer may have a sheet-shaped base and an electrically conductive pattern part formed in a given pattern on one surface of the base. In such an optical sheet of the invention, the electrically conductive pattern part may be situated on a surface, on the observer side, of the base, and irregularities for diffusing light may be formed on the other surface, on the side opposite to the observer side, of the base. Alternatively, in such an optical sheet of the invention, the electrically conductive pattern part may be situated on a surface, on the observer side, of the base, an adhesive layer for bonding the electromagnetic-wave shield layer to other layer may be situated on the observer side of the electromagnetic-wave shield layer, and the adhesive layer may include light-diffusing particles.

Furthermore, the optical sheet according to the present invention can further comprise a light-diffusing layer having a function of diffusing light, wherein the light-diffusing layer may be positioned on the side opposite to the observer side relative to the optical functional sheet layer.

A display according to the present invention comprises any one of the above-described optical sheets.

A first plasma television according to the present invention comprises a plasma display panel and any one of the above-described optical sheets which is situated on an image-displaying side of the plasma display panel.

A second plasma television according to the present invention comprises the above-described optical sheet and a plasma display panel, wherein the optical sheet further includes a base plate layer adhered directly or indirectly with the optical functional sheet layer, only the electromagnetic-wave shield layer being formed as a separate member from the base plate layer, and wherein the plasma display panel is adhered directly or indirectly with the electromagnetic-wave shield layer formed as a separate member.

According to the present invention, there can be obtained an optical sheet capable of enhancing the contrast of image light to be provided to an observer.

Moreover, according to the present invention, a moiré pattern due to the arrangement of the prisms can be made less noticeable.

BRIEF DESCRIPTION OF THE DRAWINGS

FIG. 7 is a cross-sectional view of an optical sheet in the third embodiment of the invention and diagrammatically shows the laminated structure of the optical sheet.

DETAILED DESCRIPTION OF THE INVENTION

Embodiments of the present invention will be described hereinafter with reference to the accompanying drawings.

Figure 1:
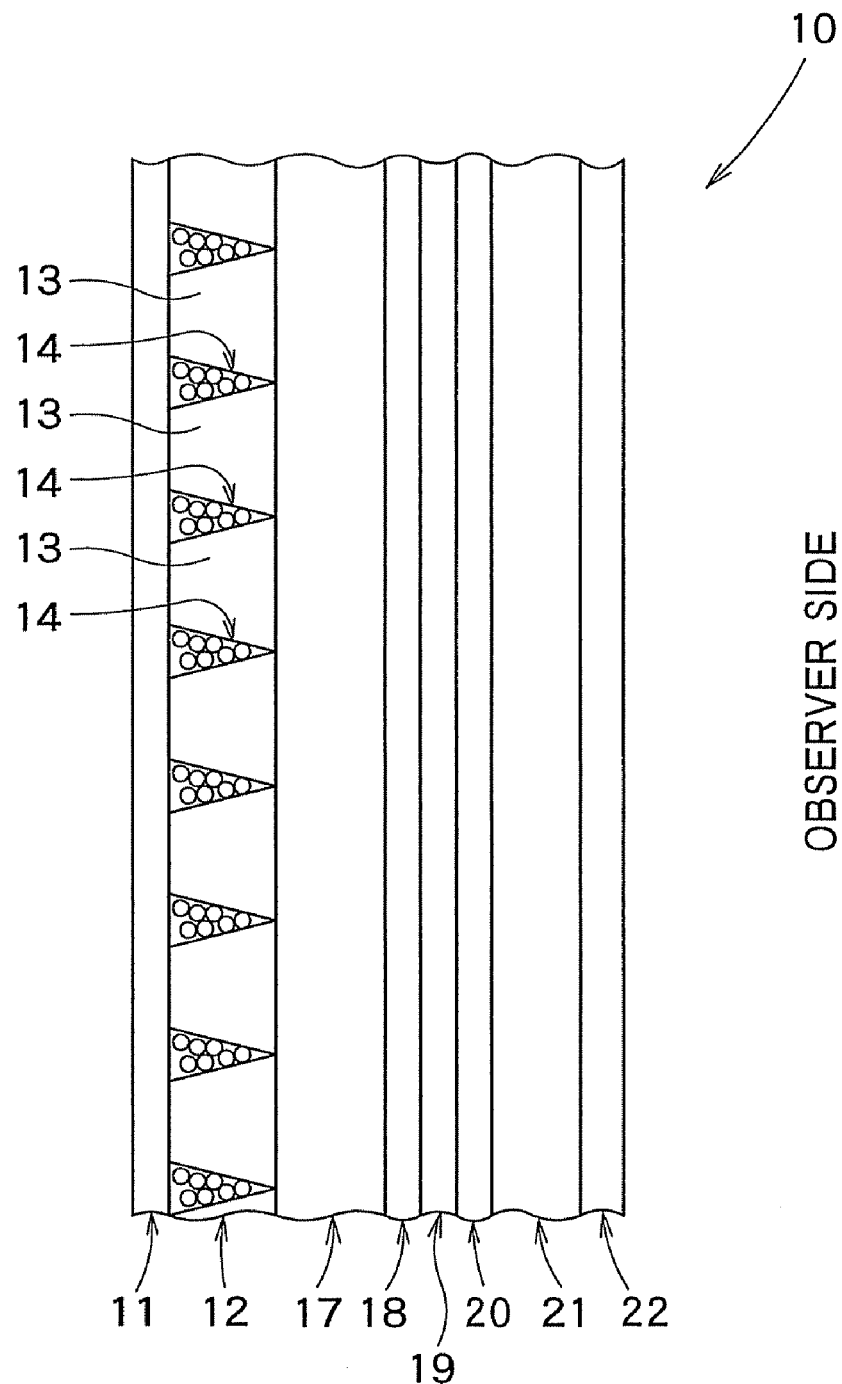
FIG. 1 is a cross-sectional view of an optical sheet in the first embodiment of the present invention and diagrammatically shows the laminated structure of the optical sheet.

FIG. 1 is a cross-sectional view of an optical sheet 10 in the first embodiment of the invention and diagrammatically shows the laminated construction of the optical sheet. In FIG. 1 and also in the other figures, some of the identical parts of the optical sheet are drawn without repeatedly putting reference numerals in order to make the figure neat. The optical sheet 10 is a sheet-shaped member capable of transmitting incoming light towards the observer side, and has the optical and filtering functions. The optical sheet 10 includes an electromagnetic-wave shield layer 11, an optical functional sheet layer 12, a PET film layer 17 serving as a substrate layer, a neon-ray-cutting layer 18, an infrared-cutting layer 19, a color-tone-correcting layer 20, a glass layer 21, and an anti-reflection layer 22. In this embodiment, the above-described layers extend along the normal to the sheet plane of the paper on which the figure is drawn, with the cross section shown in FIG. 1 maintained. These layers will be described below.

Figure 2:
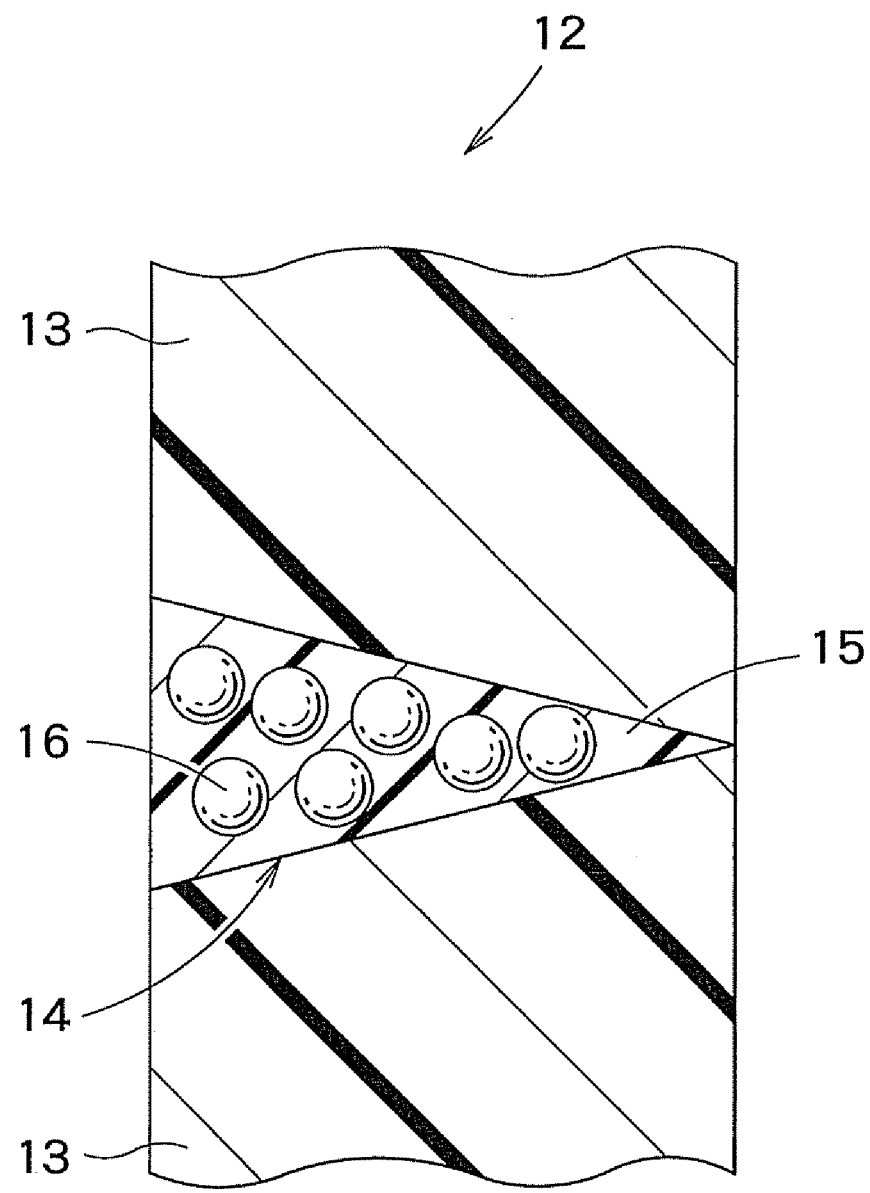
FIG. 2 is a view showing an enlarged section of a portion of the optical sheet shown in FIG. 1.

In order to facilitate understanding, the optical functional sheet layer 12 will be first described. The optical functional sheet layer 12 has prisms 13, 13, . . . , each prism being in a nearly trapezoidal shape in a cross section taken perpendicularly to the sheet plane (the light-exiting face) of the optical sheet 10, and light-absorbing parts 14, 14, . . . , one light-absorbing part being situated between two adjacent prisms 13, 13, as shown in FIG. 1. FIG. 2 is a view showing an enlarged section of one light-absorbing part 14 and two prisms 13, 13 adjacent to the light-absorbing part 14, contained in the optical sheet 10 shown in FIG. 1. The optical functional sheet layer 12 will be described with reference to FIGS. 1 and 2 and some other figures.

The prisms 13, 13, . . . are so disposed that the upper base, having a smaller width than that of the lower base, and the lower base, having a greater width than that of the upper base, of the nearly trapezoidal shape section of each of prisms are on the sheet plane of the optical sheet 10. In addition, the prisms 13, 13 are so situated that the lower bases of the nearly trapezoidal shape sections of the prisms face PET film layer 17 side. Further, the prisms 13, 13, . . . are made from a light-transmitting resin having a refractive index of Np. The light-transmitting resin is usually a resin having the property of curing in ionizing radiation (e.g., ultraviolet light), etc., such as urethane acrylate.

The light-absorbing parts 14, 14, . . . are elements placed between the prisms 13, 13, . . . and, as shown in FIGS. 1 and 2, the light-absorbing parts 14, 14, . . . are nearly triangular in a cross section taken along the direction in which the light-absorbing parts 14, 14, . . . are arranged and along the normal to the light-exiting face of the optical sheet 10. The light-absorbing parts 14, 14, . . . are so disposed that their faces corresponding to the bases of their nearly triangular shape sections are on the side on which the upper bases of the nearly trapezoidal prisms 13, 13, . . . are positioned. The faces of the light-absorbing parts 14, 14, . . . , corresponding to the bases of their nearly triangular shape sections, and the faces of the prisms 13, 13, . . . , corresponding to the upper bases of their nearly trapezoidal shape sections, form a surface, of the optical functional sheet layer 12, on the side opposite to the observer side (i.e., the surface on the light-entering side). In the cross section taken along the direction in which the light-absorbing parts 14, 14, . . . are arranged (the direction in which the prisms 13, 13, . . . are arranged) and along the normal to the light-exiting face of the optical sheet 10, the angle between the oblique side of each nearly triangular shape section and the normal to the sheet plane of the optical sheet 10 is preferably more than zero, and equal to or less than 10 degrees.

Figure 3A:
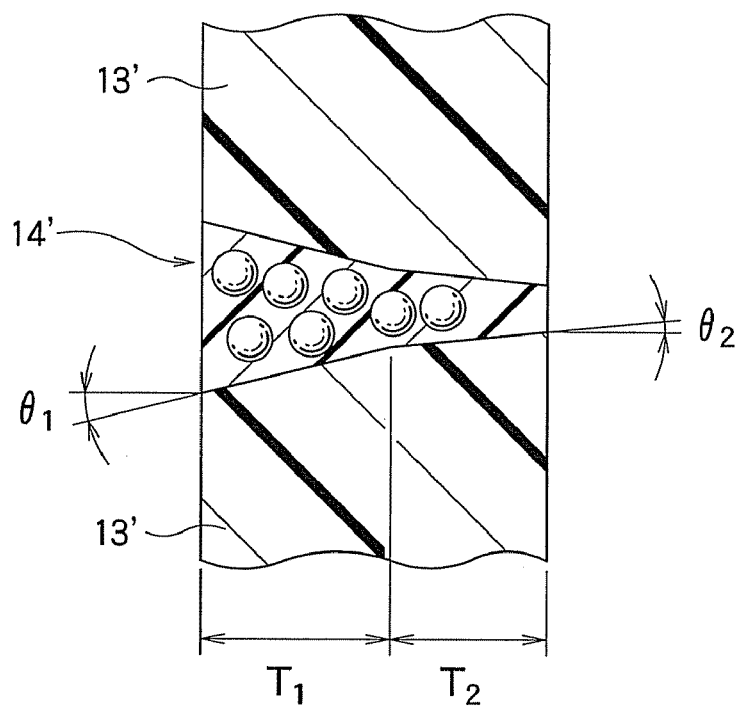
FIG. 3A is a view showing another example of the light-absorbing part.
Figure 3B:
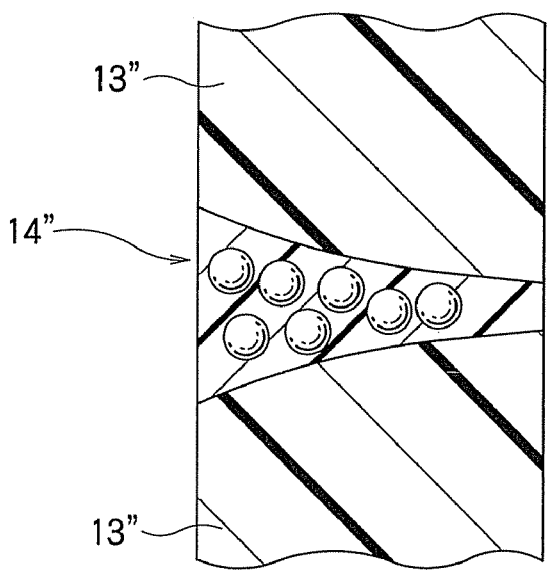
FIG. 3B is a view showing still another example of the light-absorbing part.

Further, it is not necessary that the inclination of each oblique side be constant. The oblique side may be in the shape of an broken line or even in the shape of a curved line in the cross section taken along the direction in which the light-absorbing parts 14, 14, . . . are arranged and along the normal to the light-exiting face of the optical sheet 10. FIG. 3A shows a case where the oblique sides of the light-absorbing part 14' are formed as a broken line. FIG. 3B shows a case where the oblique sides of the light-absorbing part 14" are formed as a curved. In the case shown in FIG. 3A, each oblique face of the light-absorbing part 14' (each oblique face of the prism 13') is formed not from one plane but from two planes forming an obtusely V-shaped plane. Namely, in the cross section, the light-absorbing part 14' has oblique sides in the shape of obtusely V-shaped lines. Specifically, in the cross section taken along the direction in which the light-absorbing parts 14, 14, . . . are arranged and along the normal to the light-exiting face of the optical sheet 10, the oblique side of the light-absorbing part 14 forms, on the base side of the light-absorbing part (the left-hand side in the figure, the light-entering side), an angle of $\theta 1$ with the normal to the light-exiting face of the optical sheet. On the other hand, in the cross section taken along the direction in which the light-absorbing parts 14, 14, . . . are arranged and along the normal to the light-exiting face of the optical sheet 10, the oblique side of the light-absorbing part 14 forms, on the PET film layer 17 side (the right-hand side in the figure, the light-exiting side), an angle of $\theta 2$ with the normal to the light-exiting face of the optical sheet. Preferably, these angles are in the relationship $\theta 1 > \theta 2$, and the two angles $\theta 1$, $\theta 2$ are more than zero, and equal to or less than 6 degrees. Further, the two planes forming the obtusely V-shaped plane extend in the direction of thickness of the optical functional sheet layer 12 to the distances of widths T1 and T2. It is preferred that the width T1 and the width T2 be nearly equal. Although each oblique line side of the nearly triangular shape section is formed from two lines in the cross section shown in FIG. 3A, the oblique face of the light-absorbing part may be formed from a greater number of planes, i.e., three or more planes.

In the case shown in FIG. 3B, the oblique sides of the light-absorbing part 14" (the oblique sides of the prism 13") are curved lines. Thus, the oblique faces of the light-absorbing parts 14" may also be curved planes. Also in this case, in the cross section taken along the direction in which the light-absorbing parts 14, 14, . . . are arranged and along the normal to the light-exiting face of the optical sheet 10, the angle between the oblique side having the shape of a curved line and the normal to the light-exiting face of the optical sheet is preferably smaller on the PET film layer 17 side than on the base side. Further, it is preferred that the above angle be more than zero, and equal to or less than 10 degrees, determined at any point on the curved line. Furthermore, it is preferred that the above angle be more than zero, and equal to or less than 6 degrees, determined at any point on the curved line. The angle between the oblique side having the shape of a curved line and the normal to the light-exiting face of the optical sheet is defined as the angle obtained by dividing the oblique side in the shape of a curved line into ten parts having the same distance and measuring the angle between ends of the equally-divided parts and the normal to the light-exiting face of the optical sheet.

Figure 4A:
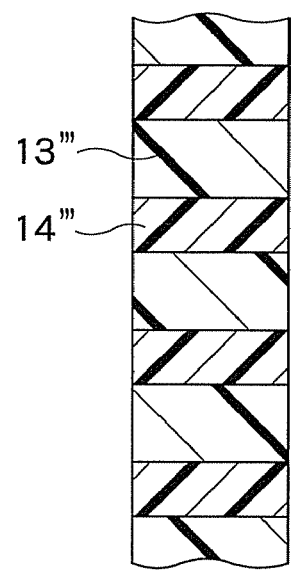
FIG. 4A is a view showing a further example of the light-absorbing part.
Figure 4B:
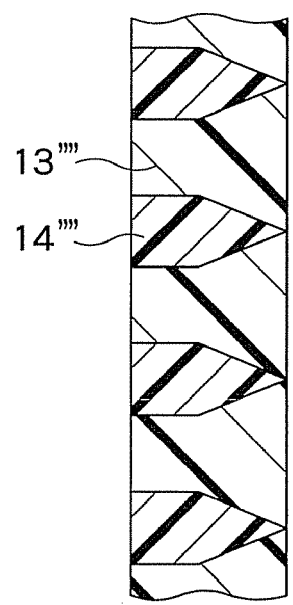
FIG. 4B is a view showing a still further example of the light-absorbing part.

Furthermore, the shape of the light-absorbing parts is not limited to examples discussed above in this embodiment, and any modified light-absorbing parts are useful as long as they can properly absorb external light. Examples of modified light-absorbing parts include those ones shown in FIGS. 4A and 4B. The sectional shape of the light-absorbing part 14''' shown in FIG. 4A is rectangular, and the sectional shape of the prism 13''' is therefore different from that of the prism 13 (see FIG. 2). The sectional shape of the light-absorbing part 14'''' shown in FIG. 4B is pentagonal. Thus, the light-absorbing parts can take various shapes so that their sectional shapes are rectangles, trapezoids, polygons, etc.

The light-absorbing parts 14, 14, . . . are made from a given material whose refractive index Nb is equal to or smaller than the refractive index of the material for the prisms 13, 13, . . . . When the refractive index Np of the prisms 13, 13, . . . is equal to or greater than the refractive index Nb of the light-absorbing parts 14, 14, . . . , the image light entering the prisms 13, 13, . . . from a light source under specified conditions can be properly reflected from the interface between the light-absorbing parts 14, 14, . . . and the prisms 13, 13, . . . , thereby providing a bright image to an observer. Although no specific limitations are imposed on the difference between the refractive indexes Np and Nb, the difference is preferably 0 or more, and 0.06 or less.

Further, each light-absorbing part 14 in this embodiment is made up of light-absorbing particles 16, 16, . . . and a binder that bridges the gap between the light-absorbing particles so as to form a binder part 15. Namely, each light-absorbing part 14 includes multiple light-absorbing particles 16, 16, . . . that can absorb light, and a binder part 15 in which the light-absorbing particles 16, 16, . . . are dispersed. Therefore, the light-absorbing parts 14, 14, . . . can absorb the image light entering them without being reflected from the interface between the prisms 13, 13, . . . and the light-absorbing parts 14, 14, . . . . Moreover, the light-absorbing parts 14, 14, . . . can properly absorb external light entering them from the observer side at specified angles, thereby enhancing the contrast of image light. The binder forming the binder part 15 may be a material having a refractive index nearly equal to the refractive index Nb of the material forming the prisms 13, 13, . . . . Any material can be used as the binder. Examples of materials herein useful as the binder include epoxyacrylates having the property of curing in ionizing radiation (e.g., ultraviolet light), etc. It is preferred that the mean particle diameter of the light-absorbing particles 16, 16, . . . be 1 μm or more. Any particles can be used as the light-absorbing particles as long as they can absorb light. For example, black-colored particles can be used as the light-absorbing particles 16, 16, . . . . Black-colored particles are on the market and are easily available.

The way in which the parts 14, 14, . . . are provided with the property of absorbing light is not limited to the aforementioned use of the light-absorbing particles 16, 16, . . . . For example, the parts 14, 14, . . . may be colored entirely with a pigment or a dye so that they can act to absorb light.

Next, the electromagnetic-wave shield layer 11 will be described. The electromagnetic-wave shield layer 11 is laminated to a surface, of the optical functional sheet layer 12, on the side on which the bases of the nearly triangular shape sections of the light-absorbing parts 14, 14, . . . are positioned. More specifically, the electromagnetic-wave shield layer 11 is situated next to the optical functional sheet layer 12, on the side opposite to the observer side (the light-entering side of the optical functional sheet layer 12). The electromagnetic-wave shield layer 11 is a layer (filter) having the property of shielding electromagnetic waves, as its name signifies. Any layer having this property can be used as the electromagnetic-wave shield layer 11 regardless of the manner in which it shields electromagnetic waves. A layer includes a sheet-shaped base and an electrically conductive pattern part formed in a given pattern on one surface of the base can be used as the electromagnetic-wave shield layer 11. Examples of the electrically conductive pattern part include a copper layer patterned into meshes. In order to obtain such an electrically conductive pattern part made of a copper layer patterned into meshes, there can be employed such a technique as etching or vacuum vapor deposition. Etching or vacuum vapor deposition makes it possible to form a fine mesh-pattern in a copper layer. The pitch, etc. in the copper meshes can be suitably determined depending on the electromagnetic waves that should be shielded. The pitch and line width in the meshes can be made about 300 μm and 12 μm, respectively.

Thus, in the optical sheet 10 of this embodiment, incorporated in a display 1 (see FIG. 8), the electromagnetic-wave shield layer 11 is situated on the image light source side (opposite to the observer side, the light-entering side) relative to the optical functional sheet layer 12. The electromagnetic-wave shield layer 11 has a strong tendency to diffusely reflect external light as compared with the other films used in the optical sheet, having other properties. Therefore, by placing the electromagnetic-wave shield layer 11 in the above position, it becomes possible to provide a high-contrast image to an observer. Further, interference fringes due to the prisms 13, 13, . . . disposed with a specified pitch in the optical functional sheet layer 12 are sometimes observed. However, according to this embodiment, the electromagnetic-wave shield layer 11 situated next to the optical functional sheet layer 12 and positioned on the side opposite to the observer side relative to the optical functional sheet layer 12, can effectively make the interference fringes less noticeable without lowering contrast. These actions and effects will be described later in detail.

Figure 15:
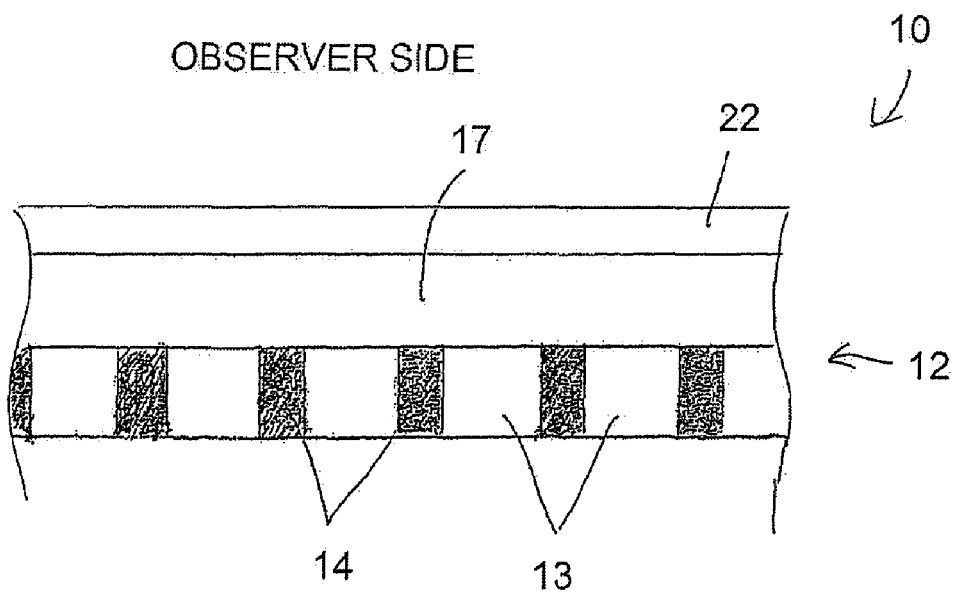
FIG. 15 depicts another example of the first embodiment of the present invention.

Next, the PET film layer 17 will be described. The PET film layer 17 is a substrate layer serving as a base on which the optical functional sheet layer 12 is formed. Namely, the optical functional sheet layer 12 is formed on the PET film layer 17. In addition, the PET film layer 17 is a film layer whose main component is PET. Although the PET film layer 17 is formed mainly from PET, other resins, etc. may also be contained in it. Moreover, a variety of additives may be incorporated in the PET film layer 17. Examples of additives that can be herein used include antioxidants such as phenolic antioxidizing agents, and stabilizers such as lactone stabilizing agents. The term "main component" herein means that an object material (PET, in this case) is contained in the substrate layer in an amount of 50% by weight or more of the whole material forming the substrate layer (the same shall apply hereinafter). FIG. 15 illustrates one example of the first embodiment of the present invention including the substrate layer.

It is not necessary that the main component of the substrate layer of the optical sheet be PET. For example, the substrate layer can contain, as a main component, a polyester resin such as polybutylene terephthalate (PBT) resin or polytrimethylene terephthalate (PTT) resin. In this embodiment, however, a resin containing PET as a main component is used as a material preferred from the viewpoint of property, mass-productivity, cost, availability, and so forth.

The neon-ray cutting layer 18, the infrared cutting layer 19, the color-tone correcting layer 20, and the antireflection layer 22 have the properties their names signify, respectively. In this embodiment, these layers are laminated on the optical functional sheet layer 12, on the side opposite to the electromagnetic-wave shield layer 11 side, i.e., on the observer side (light-exiting side) relative to the optical functional sheet layer 12, as shown in FIG. 1. The neon-ray cutting layer 18 cuts mainly neon rays exiting from a display towards the observer side. The infrared cutting layer 19 cuts infrared rays containing near infrared rays, passing through the optical sheet 10. The color-tone correcting layer 20 is for correcting more properly the color tone of the image light from the source, travelling towards the observer side. The antireflection layer 22 is for preventing external light from being reflected from the optical sheet 10. Thus the antireflection layer 22 can restrain the external light from returning to the observer side, and thus maintain clearness of the displayed image unclear.

Films, etc. that have the above-described properties and are commonly used, can be used as the above layers. For example, it is possible to use commercially available films (sheets) provided with the above properties.

The glass layer 21 is made of sheet glass and serves as a base plate layer for supporting the neon-ray cutting layer 18, the infrared-cutting layer 19, the color-tone correcting layer 20, the antireflection layer 22, etc. that are laminated on its front or back surface either directly or indirectly.

Figure 14:
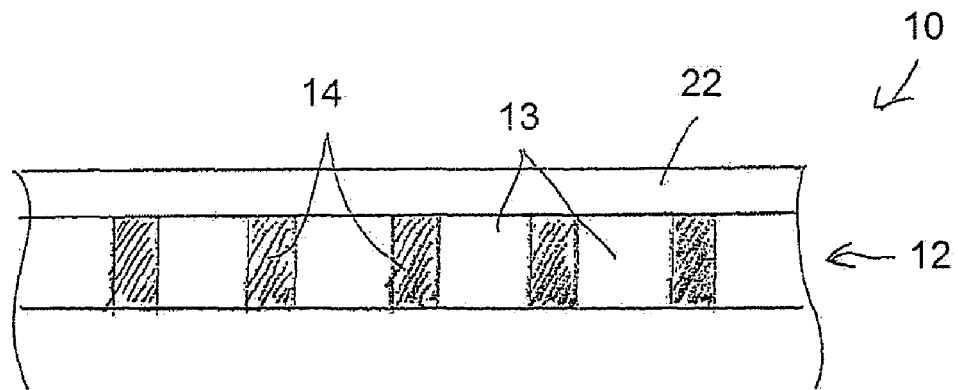
FIG. 14 depicts one example of the first embodiment of the resent invention.

The above is the detailed description of the optical sheet 10 according to the first embodiment of the invention. The structure of the optical sheet 10 is not limited to the above-described one. For example, a pressure-sensitive adhesive layer may be placed between any two of the above-described layers to fix these two layers. FIG. 14 illustrates one example of this embodiment of the present invention. Further, following the recent trend towards thinner flat displays, the component layers of the optical sheet may be laminated on a light source panel (display panel) such as a plasma display panel without using the glass layer 21. The optical sheet of the invention can also be applied to such a case, and even in this case, the effect of the optical sheet of the invention can be obtained.

Figure 5:
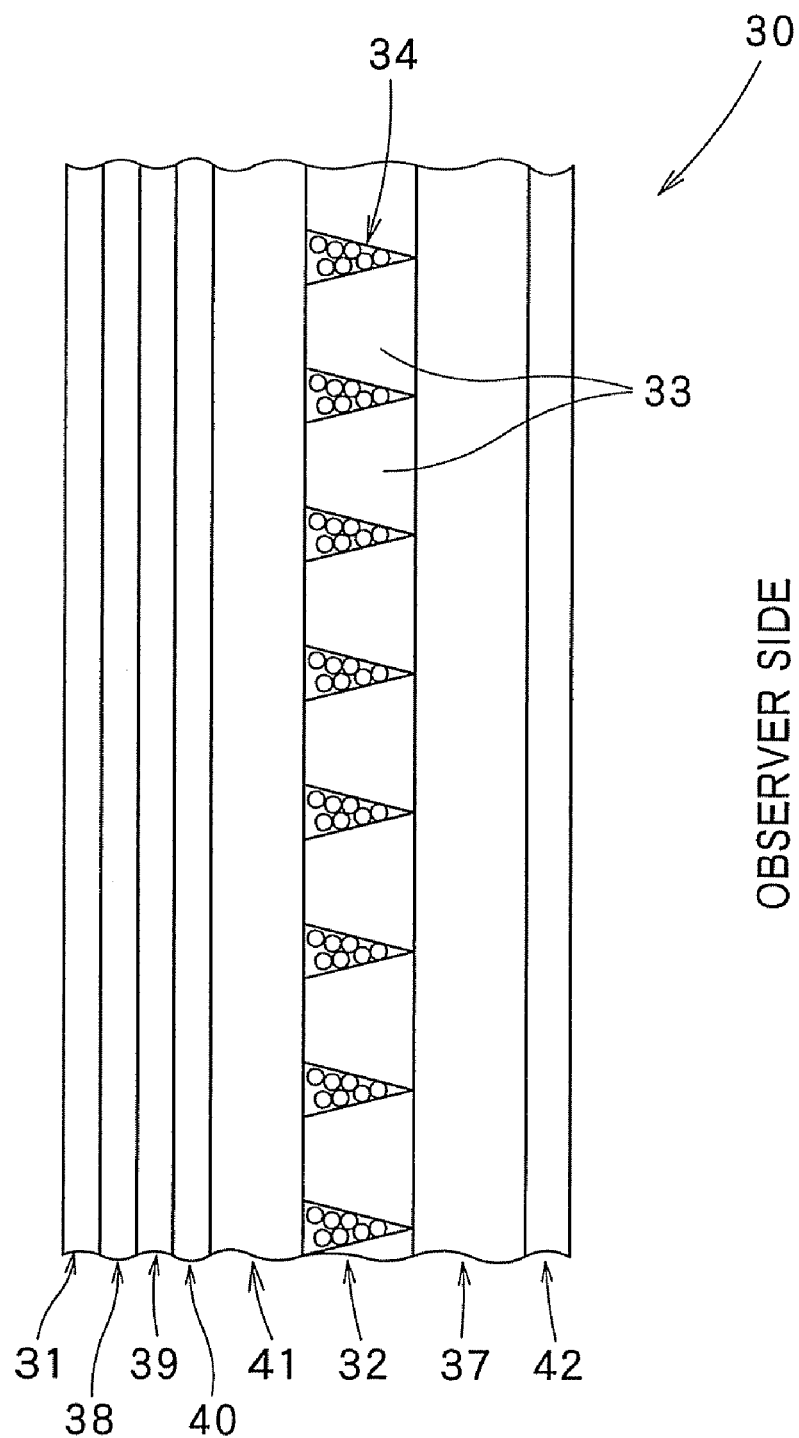
FIG. 5 is a cross-sectional view of an optical sheet in the second embodiment of the present invention and diagrammatically shows the laminated structure of the optical sheet.

Next, an optical sheet 30 according to the second embodiment of the invention will be described. FIG. 5 diagrammatically shows the laminated construction of an optical sheet 30 according to the second embodiment. Like the optical sheet 10 according to the first embodiment, the optical sheet 30 according to the second embodiment includes an electromagnetic-wave shield layer 31, a optical functional sheet layer 32, a PET film layer 37 serving as a substrate layer, a neon-ray cutting layer 38, an infrared cutting layer 39, a color-tone correcting layer 40, a glass layer 41, and an antireflection layer 42. The details of each layer in the optical sheet 30 according to the second embodiment may be the same as those of the corresponding layer in the optical sheet 10 according to the first embodiment. Therefore, structure of each layer in the optical sheet 30 according to the second embodiment will not be described in detail any more.

In the optical sheet 30 according to the second embodiment, all the layers other than the PET film layer 37 and the antireflection layer 42 are situated on the side opposite to the observer side relative to the optical functional sheet layer 32. Therefore, the optical functional sheet layer 32 can more effectively absorb light entering the optical sheet 30 from the observer side. Namely, it is possible to enhance more greatly the contrast of image light by preventing diffuse reflection of external light.

Figure 6:
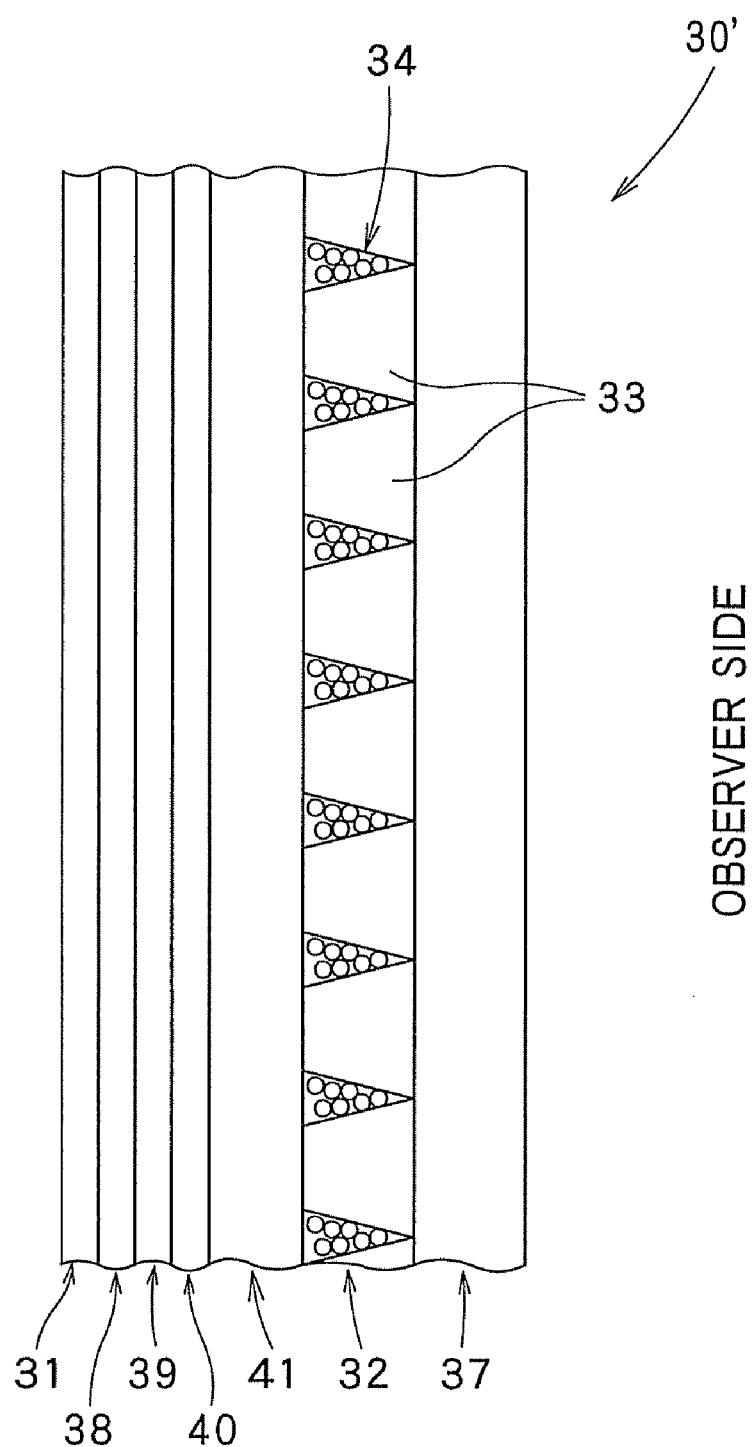
FIG. 6 is a view for illustrating a modification of the optical sheet in the second embodiment of the invention.

FIG. 6 diagrammatically shows the laminated construction of an optical sheet 30', a modification of the optical sheet 30 according to the second embodiment. In the optical sheet 30' shown in FIG. 6, the PET film layer 37, situated next to the optical functional sheet layer 32 and positioned on the observer side relative to the optical functional sheet layer 32, is the outermost layer on the observer side (the right-hand side in the figure, the light-exiting side). Namely, the optical functional sheet layer 32 that is formed on the PET film layer 37 so as to form a sheet-shaped member, as mentioned above, may be situated, together with the PET film layer 37, outermost on the observer side (the right-hand side in the figure, the light-exiting side).

Next, an optical sheet 50 according to the third embodiment of the invention will be described. FIG. 7 diagrammatically shows the laminated construction of the optical sheet 50 according to the third embodiment. In the optical sheet 50 according to the third embodiment, an electromagnetic-wave shield layer 51 exists as a separate layer from an optical functional sheet layer 52. Namely, in the case shown in FIG. 7, the electromagnetic-wave shield layer 51 is not adhered either directly or indirectly to the optical functional sheet layer 52 and forms a sheet-shaped member separate from a sheet-shaped member including the optical functional sheet layer 52. In this embodiment, the word "directly" implies that two object layers are present adjacently to each other, and the word "indirectly" implies that two object layers are present with another layer between them. In this embodiment, it is possible to fix, with an adhesive, only the electromagnetic-wave shield layer 51 to a light source such as a PDP, as will be described later. Like the optical sheet 10 according to the first embodiment, the optical sheet 50 according to the third embodiment includes an electromagnetic-wave shield layer 51, an optical functional sheet layer 52, a PET film layer 57 serving as a substrate layer, a neon-ray cutting layer 58, an infrared cutting layer 59, a color-tone correcting layer 60, a glass layer 61, and an antireflection layer 62. The details of each layer in the optical sheet 50 according to the third embodiment may be the same as those of the corresponding layer in the optical sheet 10 according to the first embodiment. Therefore, the structure of each layer in the optical sheet 50 according to the third embodiment will not be described in detail any more.

According to the lamination of the optical sheet 50 of the third embodiment, there is no need to laminate the electromagnetic-wave shield layer 51 to the optical functional sheet layer 52 whose structure is complicated, so that the optical sheet (optical member) 50 can be produced with increased productivity.

Figure 8:
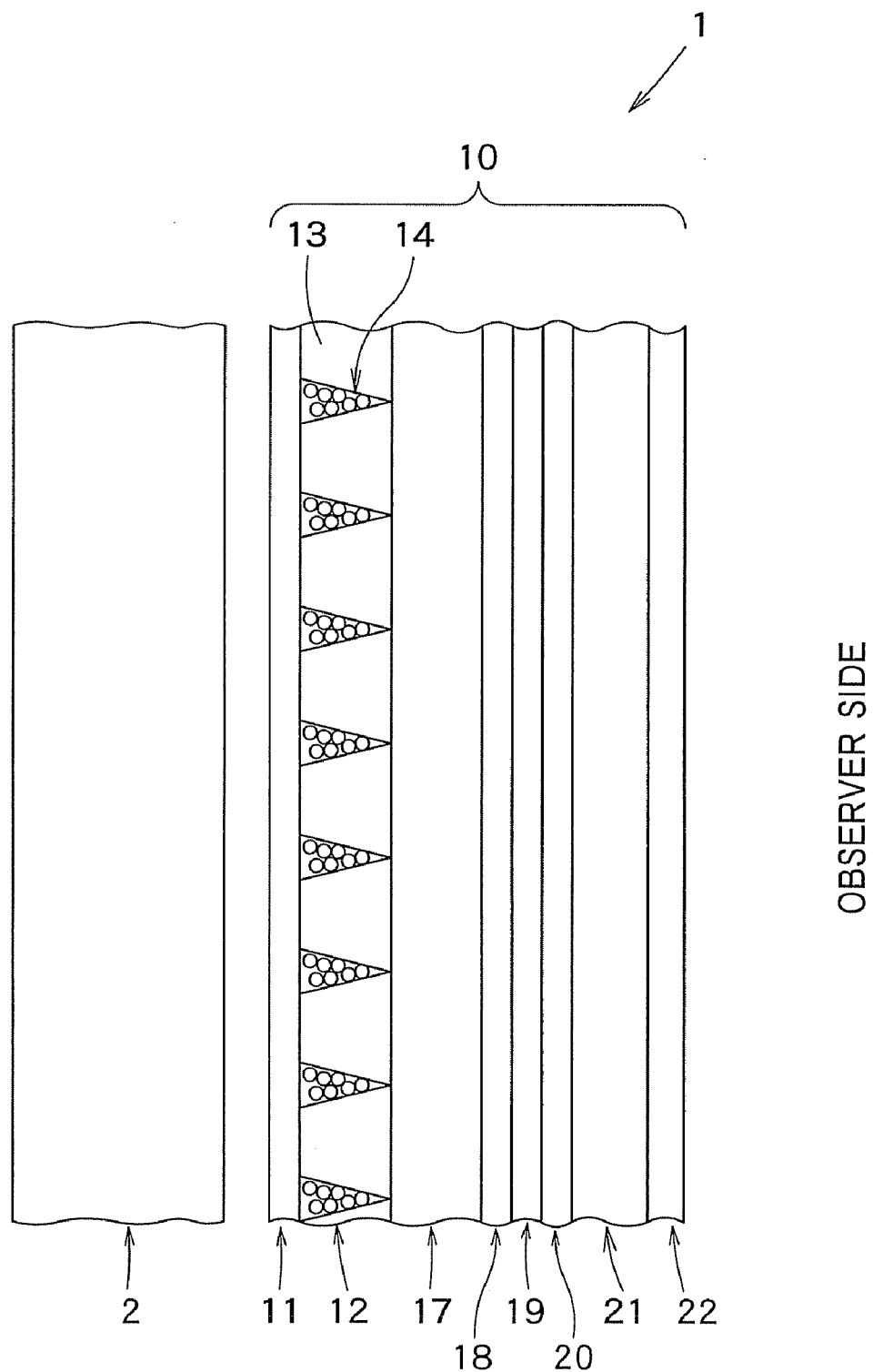
FIG. 8 is a view diagrammatically showing the laminated structure of a portion of an optical sheet and a PDP that are incorporated in a plasma television.
Figure 9:
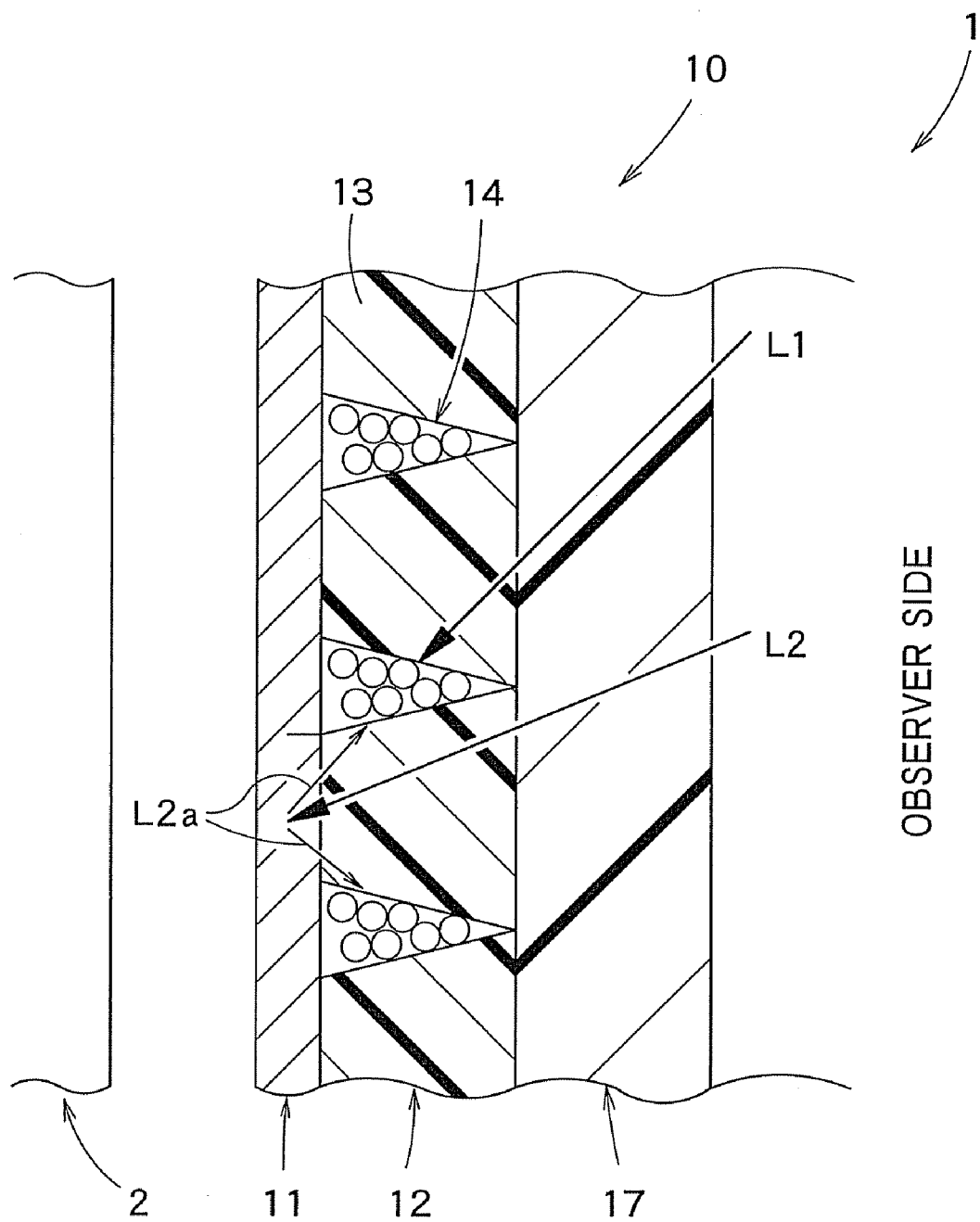
FIG. 9 is a view showing an example of the path of external light in the plasma television shown in FIG. 8.

Next, the structure of a plasma television 1, an example of a display in which the above-described optical sheet 10 according to one embodiment of the present invention is incorporated, and how the optical sheet 10 acts when the plasma television 1 displays an image, will be described. FIG. 8 is a cross-sectional view of the plasma television 1 comprising a PDP 2 and the optical sheet 10 placed on the image-light-exiting side of the PDP 2. In FIG. 8, the PDP 2 and the optical sheet 10 are shown in such a way that the positions of the PDP 2 and the optical sheet 10 can be known clearly. In FIG. 8, the right-hand side is the observer side. FIG. 9 is a view of an enlarged section of a portion of the view of FIG. 8 and illustrates light path.

As FIG. 8 shows, the optical sheet 10 according to the first embodiment is placed on the image-light-exiting side relative to the PDP 2, an image light source. Therefore, the electromagnetic-wave shield layer 11, among the other layers in the optical sheet 10, is closest to the PDP 2, and the optical functional sheet layer 12 is situated on the observer side of the electromagnetic-wave shield layer 11.

Figure 10:
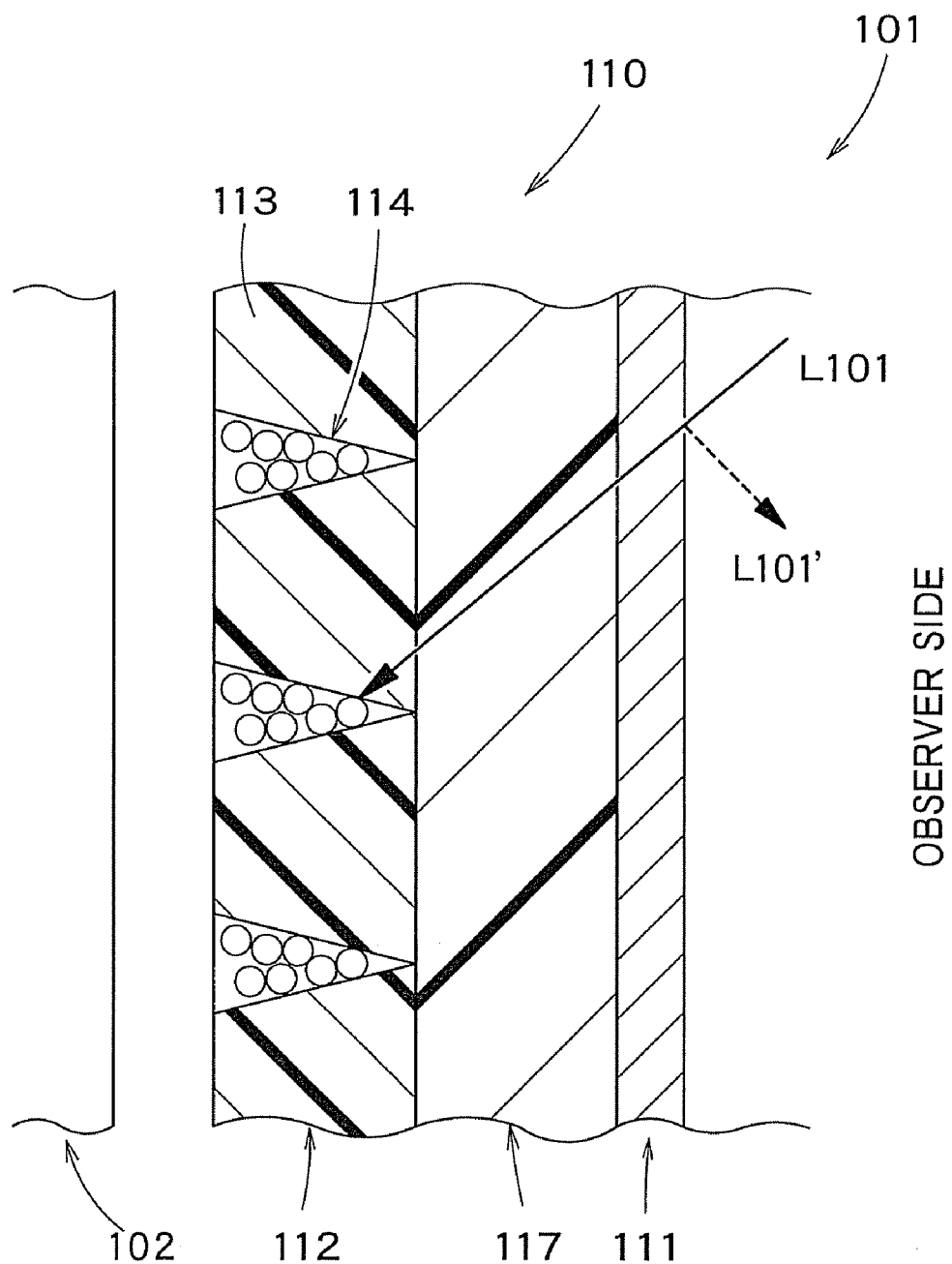
FIG. 10 is a view showing an example of the path of external light in a plasma television provided with a conventional optical sheet.

The light path, especially the path of external light, will be described with reference mainly to FIGS. 9 and 10. FIG. 10 illustrates the path of external light in a conventional optical sheet. In FIG. 9, external light L1 is light entering the optical sheet 10 from the observer side. Such external light L1 includes sunlight and indoor lamplight. The external light L1, a part of external light, is absorbed by the light-absorbing part 14, as shown in FIG. 9. Since the external light is absorbed by the light-absorbing part 14, the external light does not affect image light, and an image can thus be displayed with high contrast.

On the other hand, the electromagnetic-wave shield layer 11 having the electrically conductive pattern part made of a patterned metal film tends to diffusely reflect external light as compared with the other films in the optical sheet, having other properties. Therefore, when the electromagnetic-wave shield layer 111 is situated on the observer side relative to the optical functional sheet layer 112, as shown in FIG. 10, external light L101 tends to be partly reflected from the observer-side-surface of the electromagnetic-wave shield layer 111 and returned to the observer side (see external light L101' in FIG. 10). Namely, the optical functional sheet layer 12 in the optical sheet 10 in which the electromagnetic-wave shield layer 11 is situated next to the optical functional sheet layer 12 and situated on the side opposite to the observer side (on the PDP 2 side) relative to the optical functional sheet layer 12, effectively shows the external-light-absorbing action and can thus effectively improve contrast, as compared with the optical functional sheet layer 112 in the optical sheet 110 in which the electromagnetic-wave shield layer 111 is situated on the observer side relative to the optical functional sheet layer 112.

In the meantime, a portion L2 of the external light that has entered the optical sheet 10 passes through the prism 13 and reaches the electromagnetic-wave shield layer 11. However, a portion L2a of the light 12 diffusely reflected from the electromagnetic-wave shield layer 11 is absorbed by the light-absorbing part 14 while the portion L2a of the light 12 is returned to the observer side. Namely, the optical functional sheet layer 12 absorbs not only the external light L1 travelling towards the PDP side (the side opposite to the observer side) but also the external light L2a travelling towards the observer side. Therefore, the optical sheet 10, in which the optical functional sheet layer 12 is situated on the observer side relative to the electromagnetic-wave shield layer 11, can prevent lowering of contrast that usually occurs because of the property of diffusely reflecting light the electromagnetic-wave shield layer 11 has.

Also in the optical sheet 30, 30' according to the second embodiment, the electromagnetic-wave shield layer 31 is situated on the side opposite to the observer side (on the PDP 2 side), relative to the optical functional sheet layer 32, as shown in FIGS. 5 and 6. Therefore, also when the optical sheet 30, 30' according to the second embodiment is used in a display 1, the optical functional sheet layer 32 can effectively absorb external light and can thus effectively enhance contrast.

Figure 11:
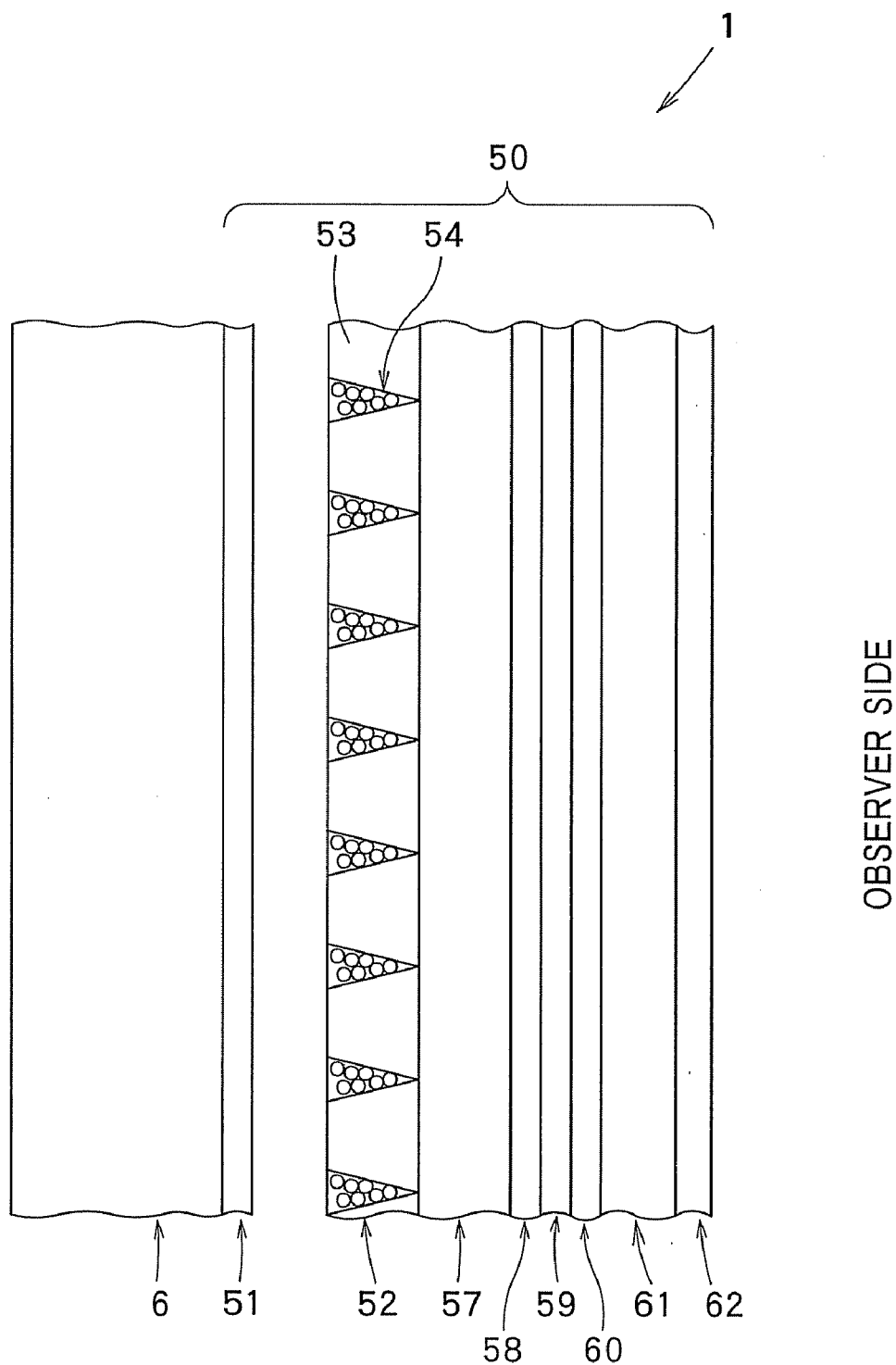
FIG. 11 is a view diagrammatically showing the laminated structure of a portion of a PDP and the optical sheet in the third embodiment that are incorporated in a plasma television.

FIG. 11 is a view similar to that of FIG. 8 and diagrammatically shows the laminated construction of a plasma television 1 in which the optical sheet 50 according to the third embodiment is incorporated. As FIG. 11 shows, in the plasma television 1 in which the optical sheet 50 according to the third embodiment is incorporated, the electromagnetic-wave shield layer 51 is attached to a PDP 2 and thus exists as a separate member (separate layer) from the other films in the optical sheet 50. Also in the plasma television 1 shown in FIG. 11, the optical functional sheet layer 52 situated on the observer side relative to the electromagnetic-wave shield layer 51 effectively absorbs external light, so that contrast can be effectively enhanced.

In the meantime, in the optical sheet 10, 30, 30', 50, the prisms 13, 33, 53 that transmit light are disposed along the sheet plane of the optical sheet 10, 30, 30', 50 with a specified pitch. When such an optical sheet 10, 30, 30', 50 is used together with a PDP 2, interference fringes (fringe pattern) are sometimes observed clearly.

Generally, since the PDP 2 has specified pixels, it is expected that there will occur moiré fringes due to both of the pitch with which the pixels are arranged and the pitch with which the prisms 13, 33, 53 are arranged. A known measure taken to make the moiré fringes less noticeable is that the pitch with which the pixels are arranged and the pitch with which the prisms 13, 33, 53 are arranged are adjusted so that the ratio between the two pitches falls in a specified range. It is also known that a layer having the property of greatly diffusing light can make the moiré pattern less noticeable.

However, the present inventors have earnestly studied and found that it is impossible to make interference fringes (moiré fringes) that occurred when the optical sheet 10, 30, 30', 50 is used together with the PDP 2 less noticeable only by controlling the pitch with which the pixels are disposed and the pitch with which the prisms 13, 33, 53 are disposed. Further, although a layer having the property of greatly diffusing light can make the moiré fringes less noticeable, such a greatly diffusing layer diffusely reflects not only external light but also image light. Namely, although the use of a light-diffusing layer is effective in making the moiré fringes less noticeable, it causes another problem, lowering of contrast.

On the other hand, the optical sheet 10, 30, 30', 50 in which the optical functional sheet layer 12, 32, 52 is situated on the observer side relative to the electromagnetic-wave shield layer 11, 31, 51 can effectively make the moiré fringes less noticeable, as supported by the results of the evaluations made in the following Examples. Although the mechanism that makes the moiré fringes less noticeable has not yet been fully understood, one possible mechanism will be explained below with reference mainly to FIG. 12. However, this mechanism is not explained as limiting the present invention.

Figure 12:
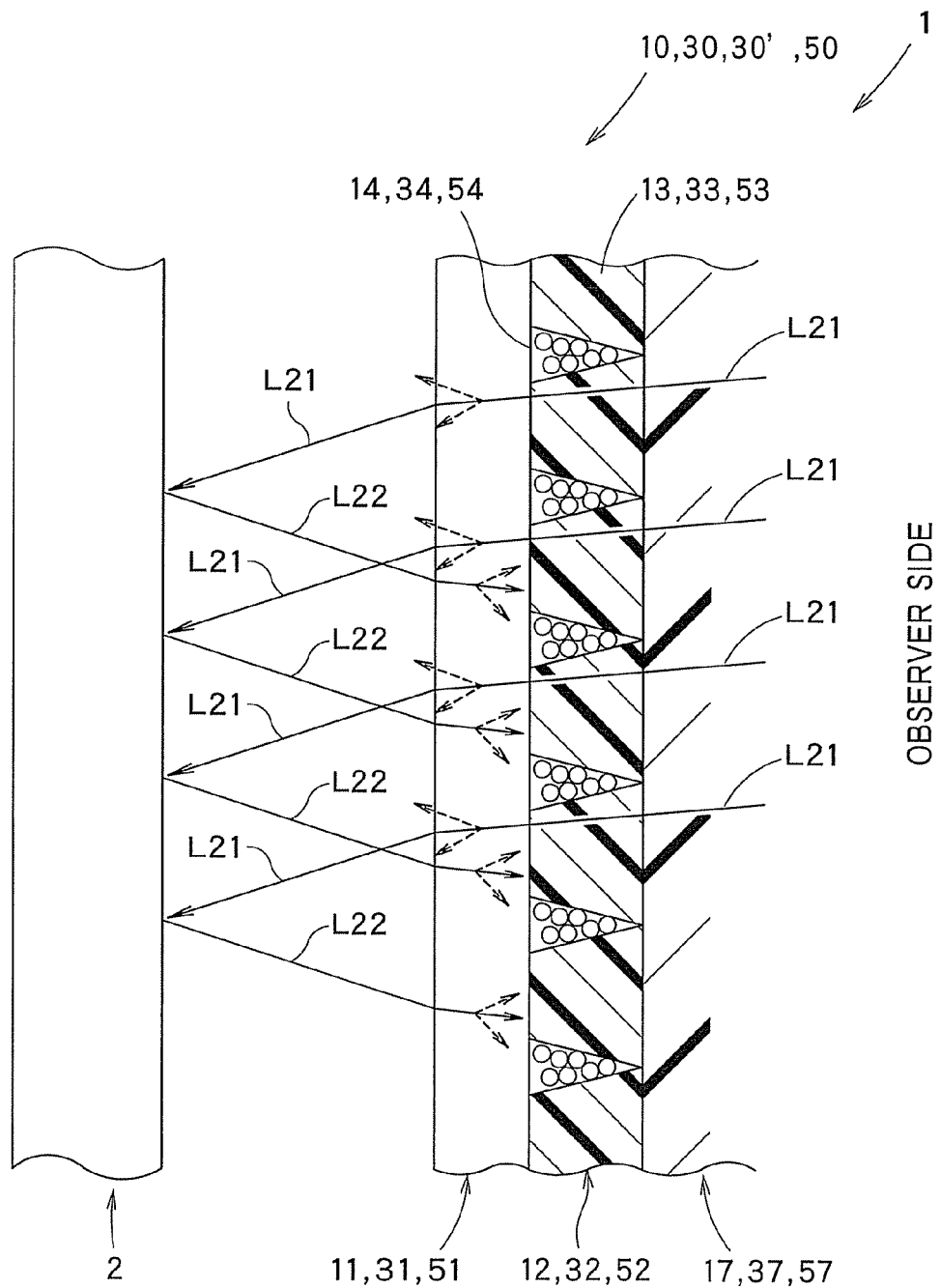
FIG. 12 is a view showing an example of the path of external light in a plasma television.

As FIG. 9 shows, external light that has entered the optical sheet 10, 30, 30', 50 situated on the observer side relative to the PDP 2 is partly absorbed by the light-absorbing parts 14, 34, 54. On the other hand, as FIG. 12 shows, external light L21 entering the optical sheet 10, 30, 30', 50 at a small angle relative to the normal to the light-exiting face of the optical sheet 10, 30, 30', 50 partly passes through the prisms 13, 33, 53 and travels towards the PDP 2 from the observer side. Since the PDP 2 has phosphors for emitting visible light, the phosphors reflects the external light L21 entering the phosphors from the observer side, towards the observer side at a high reflectance. The intensity of the reflected light L22 traveling again towards the optical functional sheet layer 12, 32, 52 varies periodically along the direction in which the prisms 13, 33, 53 are arranged. The cycle with which the intensity of the light L22 varies corresponds to the pitch with which the prisms 13, 33, 53 are arranged.

It is expected that, because of the cycle of this cyclic light L22 and the pitch with which the prisms 13, 33, 53 are disposed, interference fringes (hereinafter also referred to as "self-moiré" in order to distinguish them from moiré fringes due to both of the pitch with which pixels are disposed on the PDP 2 and to the pitch with which the prisms 13, 33, 53 are disposed) will occur. Since the cycle of the cyclic light L22 corresponds to the pitch with which the prisms 13, 33, 53 are disposed, it is presumed that controlling the pitch with which the prisms 13, 33, 53 are disposed is not effective in making the self-moiré less noticeable. On the other hand, it is presumed that the self-moiré can be made less noticeable by placing a layer having the function of diffusing light although such a layer lowers contrast.

In the aforementioned optical sheet 10, 30, 30', 50, the electromagnetic-wave shield layer 11, 31, 51 is situated between the optical functional sheet layer 12, 32, 52 and the PDP 2. The electromagnetic-wave shield layer 11, 31, 51 diffuses light more greatly than the other layers in the optical sheet 10, 30, 30', 50, though the absolute amount of the light the electromagnetic-wave shield layer diffuses is extremely small. Therefore, the light L21 that has passed through the optical functional sheet layer 12, 32, 52 and entered the electromagnetic-wave shield layer 11, 31, 51 is diffused as shown in FIG. 12 by the dotted lines. The light L22 that has been reflected from the PDP 2 and re-entered the electromagnetic-wave shield layer 11, 31, 51 is further diffused as shown in the figure by the dotted lines. Consequently, the electromagnetic-wave shield layer 11, 31, 51 diffuses two times the light that is the cause of self-moiré. It is thus presumed that the periodicity of the light L22 re-entering the optical functional sheet layer 12, 32, 52 will be reduced. Namely, it is considered that, since the electromagnetic-wave shield layer 11, 31, 51 diffuses light two times so as to reduce the periodicity of the light, no interference fringes (self-moiré) occur.

Further, as mentioned above, the electromagnetic-wave shield layer 11 diffusely reflects light, so that, regardless of the angle at which external light has entered the optical sheet 10, 30, 30', 50, the optical functional sheet layer 12, 32, 52 can partly absorb the light L22 that has been reflected from the PDP 2 and is traveling towards the observer side. It is therefore considered that the electromagnetic-wave shield layer can prevent the occurrence of interference fringes (self-moiré) regardless of the angle at which external light comes in the optical sheet 10, 30, 30', 50 and of the angle at which an observer observes the optical sheet 10, 30, 30', 50.

Even when the electromagnetic-wave shield layer 11, 31, 51 is situated on the observer side relative to the optical functional sheet layer 12, 32, 52, external light that causes self-moiré passes through the electromagnetic-wave shield layer 11, 31, 51 two times. In this case, however, the light-diffusing property of the electromagnetic-wave shield layer 11, 31, 51 acts only to scatter the once produced interference fringes (self-moiré) to make them less noticeable, and does not act to prevent interference fringes (self-moiré) for occurring. It can therefore be presumed that the electromagnetic-wave shield layer situated on the observer side of the optical functional sheet layer cannot fully make the interference fringes less noticeable, as supported by the results of the evaluations made in the following Examples.

In the meantime, the image light from the PDP 2 passes, only once, through the electromagnetic-wave shield layer 11, 31, 51 that has the property of slightly diffusing light. Therefore, the image light is never diffused excessively so as to form a poor-quality image.

Further, from the above viewpoint, it is effective that a light-diffusing layer 70 having the function of diffusing light is further placed on the side opposite to the observer side relative to the optical functional sheet layer 12, 32, 52, when the self-moiré cannot be fully made less noticeable.

Figure 13A:
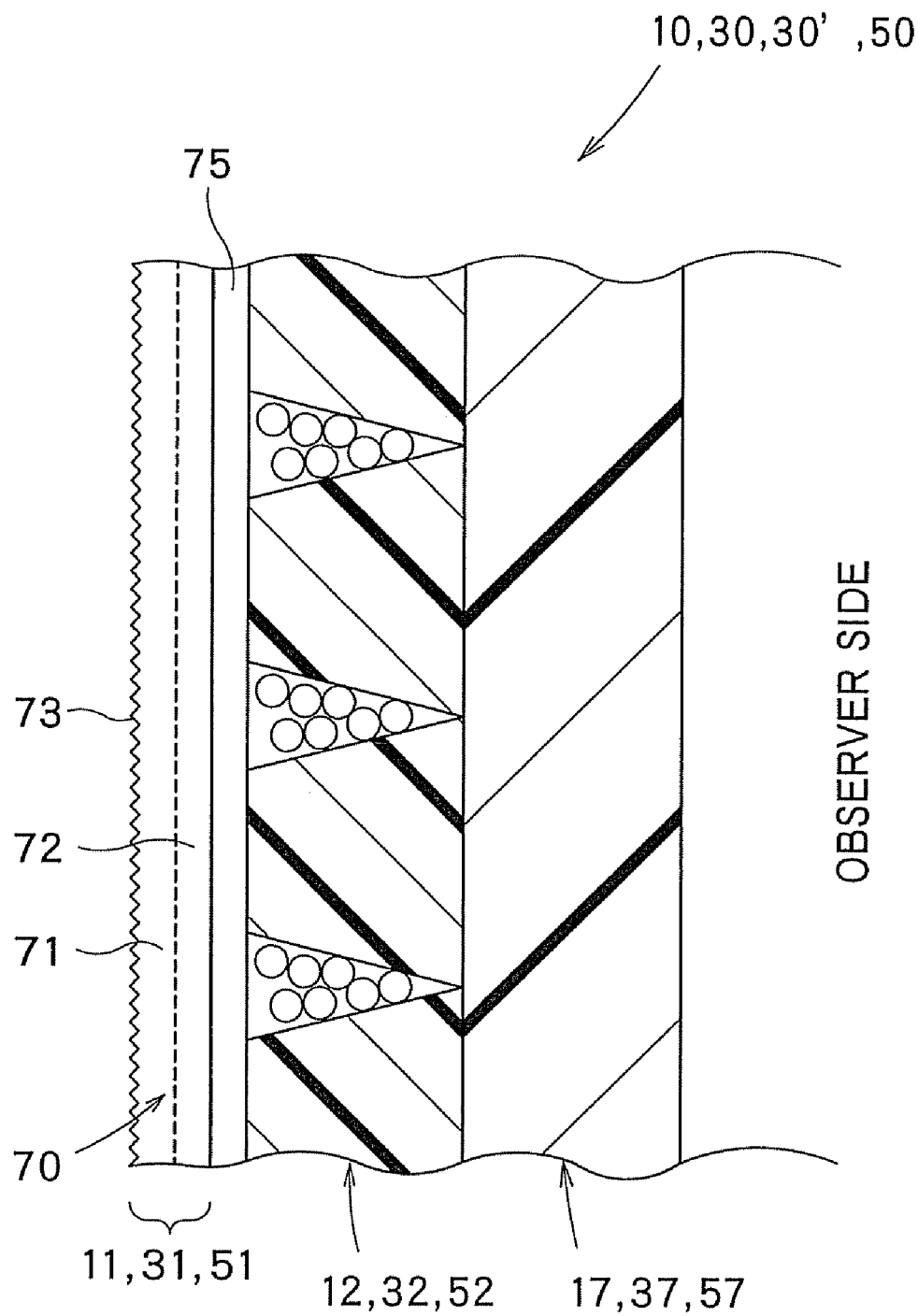
FIG. 13A is a view showing a modified optical sheet.

Specifically, the above embodiment is as follows. As shown in FIG. 13A, in the electromagnetic-wave shield layer 11, 31, 51, an electrically conductive pattern part 72 is formed on a surface, on the observer side of the base 71, and irregularities 73 that diffuse light are made in the other surface of the base 71. In this case, the electromagnetic-wave shield layer 11, 31, 51 also functions as the light-diffusing layer 70. In FIG. 13A, the electromagnetic-wave shield layer 11, 31, 51 is fixed to the optical functional sheet layer 12, 32, 52 with an adhesive layer 75.

Figure 13B:
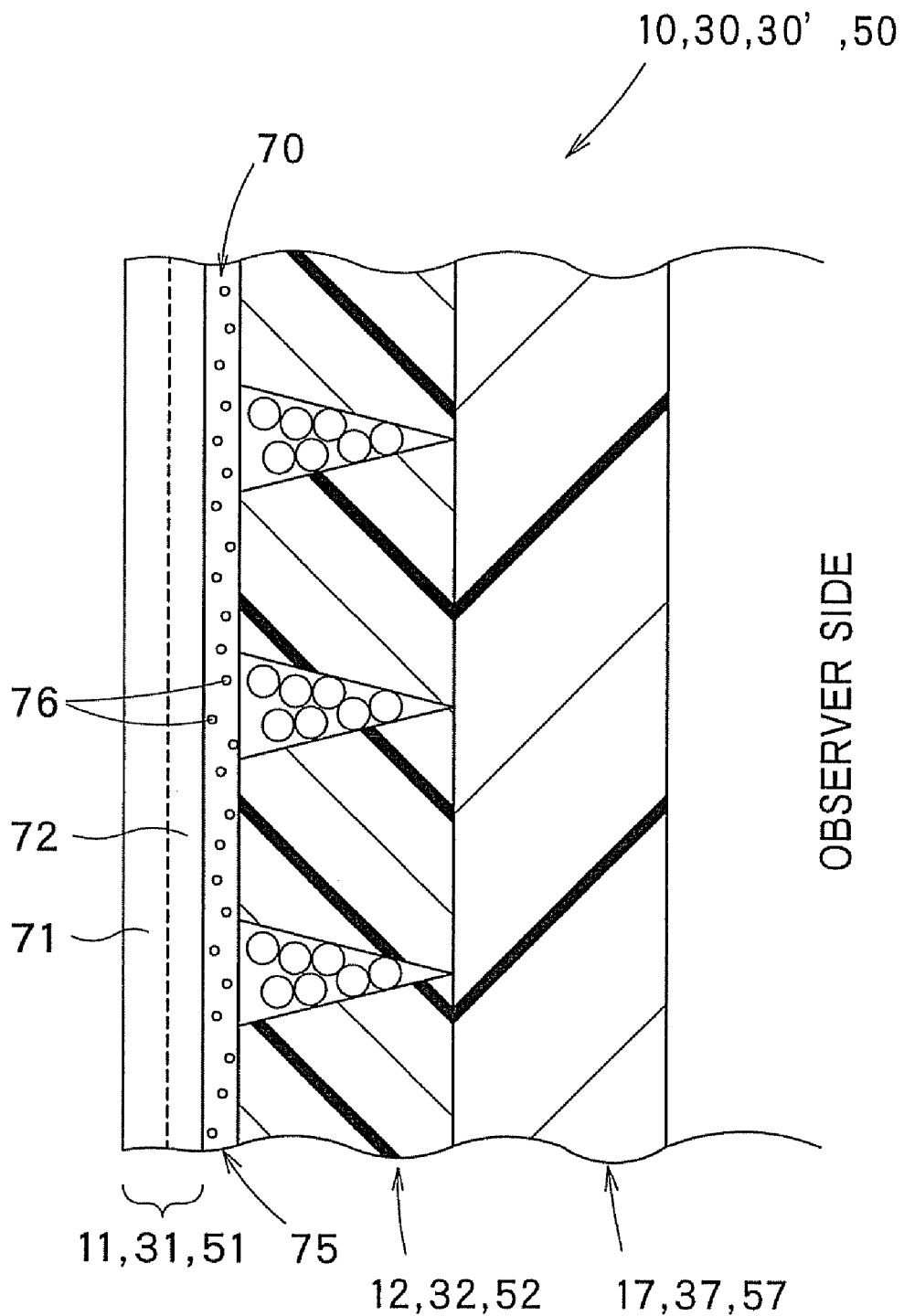
FIG. 13B is a view showing another modified optical sheet.

Another possible embodiment is as follows. As shown in FIG. 13B, in the electromagnetic-wave shield layer 11, 31, 51, an electrically conductive pattern part 72 is formed on a surface, on the observer side of the base 71, and an adhesive layer 75 containing light-diffusing particles 76, useful for bonding the electromagnetic-wave shield layer 11, 31, 51 to other layer, is situated on the observer side of the electromagnetic-wave shield layer 11, 31, 51. The adhesive layer herein encompasses a pressure-sensitive adhesive layer.

Referring to the embodiments that are considered to be most practical and preferred at the present time, the present invention has been described. However, the present invention is not limited to the above-described embodiments. The aforementioned embodiments are to be considered in all respects as illustrative and not restrictive, and various changes may be made without departing from the scope of the invention.

For example, in the aforementioned embodiments, the optical sheet 10, 30, 30', 50 includes the base plate layer 21, 41, 61, and the optical functional sheet layer 12, 32, 52 is bonded to the base plate layer 21, 41, 61 either directly or indirectly. The present invention is not limited to this, and the optical functional sheet layer 12, 32, 52 may be bonded to a plasma display panel 2 together with the electromagnetic-wave shield layer 11, 31, 51. Similarly, the layers in the optical sheet 10, 30, 30', 50 other than the optical functional sheet layer 12, 32, 52 and the electromagnetic-wave shield layer 11, 31, 51 also may be bonded to a plasma display panel 2. Moreover, the base plate layer 21, 41, 61 may be eliminated from the optical sheet 10, 30, 30', 50.

EXAMPLES

By way of the following Examples, the present invention will now be explained more specifically. However, these examples are not intended to limit or restrict the scope of the invention in any way.

Plasma televisions according to Examples and Comparative Examples were produced in the following manner, and contrast and self-moiré on each plasma television were evaluated.

Samples

Example 1

An electromagnetic-wave shield layer (EMI) was placed on the image-light-exiting face of a plasma display panel (PDP), and a optical functional sheet layer (CRF) was bonded to the observer-side-surface of the electromagnetic-wave shield layer with an adhesive layer (PSA). The electromagnetic-wave shield layer was the previously-mentioned layer having a transparent base and an electrically conductive pattern part made of a meshed copper film, formed on the observer-side-surface of the transparent base. The adhesive layer contained no light-diffusing particles. In this manner, there was produced a plasma television according to Example 1, composed of the plasma display panel (PDP), the electromagnetic-wave shield layer (EMI), the adhesive layer (PSA), and the optical functional sheet layer (CRF).

Example 2

A plasma television according to Example 2 was produced in the same manner as in Example 1, except that light-diffusing particles were disposed in the adhesive layer with which the electromagnetic-wave shield layer and the optical functional sheet layer were bonded to each other.

Example 3

A plasma television according to Example 3 was produced in the same manner as in Example 1, except that irregularities were made in the PDP-side-surface of the transparent base of the electromagnetic-wave shield layer so as to make the surface matted.

Comparative Example 1

A plasma television according to Comparative Example 1 was produced in the same manner as in Example 1, except that the electromagnetic-wave shield layer (EMI) and the optical functional sheet layer (CRF) were laminated in the order reverse to that in the plasma television according to Example 1.

Comparative Example 2

The same optical functional sheet layer (CRF) as in Example 1 was placed on the image-light-exiting face of a plasma display panel (PDP). In this manner, there was produced a plasma television according to Comparative Example 2 composed of the plasma display panel (PDP) and the optical functional sheet layer (CRF).

Comparative Example 3

The same electromagnetic-wave shield layer (EMI) as in Example 1 was placed on the image-light-exiting face of a plasma display panel (PDP). In this manner, there was produced a plasma television according to Comparative Example composed of the plasma display panel (PDP) and the electromagnetic-wave shield layer (EMI).

<Evaluation of Contrast>

Lamplight is applied, from the observer side, to the display face of the plasma display at an angle of 45° relative to the normal to the display face such that the illuminance on the display face is 150 lux. The ratio of the brightness of the plasma display panel (PDP) displaying white in the lamplight relative to the brightness of the PDP displaying black in the lamplight is taken as contrast.

The results of the evaluations of the plasma televisions of Examples 1 to 3 and Comparative Examples 1 to 3 are shown in Table 1.

<Evaluations of Interference Fringes>

At different angles of projection, external light was projected on each plasma television displaying no image, and the plasma television was observed as to whether interference fringes were noticeable or not. The results are shown in Table 1. In Table 1, the plasma television on which the interference fringes were noticeable when external light was projected at a certain angle is indicated by x, and the plasma television on which the interference fringes were not noticeable regardless of the angle at which external light was projected is indicated by O.

TABLE 1

Results of Evaluations

| Sample | Laminated Structure | Contrast | Interference Fringes |
|---|---|---|---|
| Example 1 | PDP/EMI/PSA/CRF | 46.7 | O |
| Example 2 | PDP/EMI/PSA(containing light-diffusing particles)/CRF | 46.0 | O |
| Example 3 | PDP/EMI(with a matted surface on the PDP side)/PSA/CRF | 46.0 | O |
| Comparative Example 1 | PDP/CRF/PSA/EMI | 41.9 | X |
| Comparative Example 2 | PDP/CRF | 46.5 | X |
| Comparative Example 3 | PDP/EMI | 26.0 | O |

The invention claimed is:

1. A plasma television comprising:
a plasma display panel; and
an optical laminate situated on an image-displaying side of the plasma display panel and adhering to the plasma display panel,
wherein the optical laminate has a layer configured to control light incident on the layer and then allow the light to exit towards an observer side, wherein the optical laminate includes:
an optical functional sheet layer having multiple prisms capable of transmitting light and multiple light-absorbing parts capable of absorbing light, the multiple prisms and the multiple light-absorbing parts being arranged alternately along a sheet plane of the optical laminate;
a layer having a function of shielding electromagnetic waves; and
a layer having a function of preventing reflection of light;
wherein the layer having a function of shielding electromagnetic waves is positioned on a side opposite to the observer side relative to the optical functional sheet layer, and the optical functional sheet layer is positioned between the layer having a function of shielding electromagnetic waves and the layer having the function of preventing reflection of light,
wherein the optical laminate is composed of a plurality of layers adhered to each other, the plurality of layers at least including the optical functional sheet layer, the layer having a function of shielding electromagnetic waves, and the layer having a function of preventing reflection of light, and
wherein the layer having a function of shielding electromagnetic waves also functions to diffuse light.

2. The plasma television according to claim 1,
wherein the layer having the function of preventing reflection of light is positioned outermost on the observer side of the optical laminate.

3. The plasma television according to claim 2, wherein the optical laminate further comprises a substrate layer positioned next to the optical functional sheet layer.

4. The plasma television according to claim 1, wherein the optical laminate further comprises a substrate layer positioned next to the optical functional sheet layer.

5. The plasma television according to claim 1,
wherein the layer having the function of preventing reflection of light is positioned outermost on the observer side of the optical laminate, and
wherein the optical functional sheet layer is positioned directly next to the layer having the function of preventing reflection of light, or positioned directly next to an adhesive layer contacting the layer having the function of preventing reflection of light.

6. The plasma television according to claim 1, wherein the optical laminate further comprises a substrate layer positioned next to the optical functional sheet layer,
wherein the layer having the function of preventing reflection of light is positioned outermost on the observer side, and
wherein the substrate layer is positioned directly next to the layer having the function of preventing reflection of light, or directly next to an adhesive layer contacting the layer having the function of preventing reflection of light.

7. The plasma television according to claim 1,
wherein, in a cross-section taken along a normal to a light-exiting face of the optical laminate, each of the multiple prisms has nearly a trapezoidal shape with a lower base having a greater width and an upper base having a smaller width, the lower base being positioned on the observer side and the upper base being positioned on the side opposite to the observer side,
wherein each of the light-absorbing parts has nearly a triangular shape with its base being positioned on the same side as the upper base of the nearly trapezoidal shape section of each of the multiple prisms, and
wherein, in the cross-section taken along the normal to the light-exiting face of the optical laminate, an oblique line extending from one end of the base and defining one of the sides of the nearly triangular shape section of each of the light-absorbing parts includes at least one of a curved line and a broken line, such that an angle between the oblique line and the normal to the light-exiting face of the optical laminate, determined at one side in a thickness direction of the optical laminate, is different from an angle between the oblique line and the normal to the light-exiting face of the optical laminate, determined at the other side in the thickness direction of the optical laminate.

8. The plasma television according to claim 1, wherein, in a cross-section taken along a normal to a light-exiting face of the optical laminate, each of the multiple prisms has nearly a trapezoidal shape with a lower base having a greater width and an upper base having a smaller width, the lower base being positioned on the observer side and the upper base being positioned on the side opposite to the observer side, and wherein each of the light-absorbing parts has nearly a triangular shape with its base being positioned on the same side as the upper base of the nearly trapezoidal shape section of the each of the multiple prisms, wherein, in the cross-section taken along the normal to the light-exiting face of the optical laminate, an oblique line extending from one end of the base and defining one of the sides of the nearly triangular shape section of each of the light-absorbing parts includes a broken line such that an angle between the oblique line and the normal to the light-exiting face of the optical laminate, determined at one side in a thickness direction of the optical laminate, is different from an angle between the oblique line and the normal to the light-exiting face of the optical laminate, determined at the other side in the thickness direction of the optical laminate, and wherein an angle between the oblique line and the normal to the light-exiting face of the optical laminate, determined at any point in the thickness direction of the optical laminate, is more than zero and equal to or less than 10 degrees.

9. The plasma television according to claim 1, wherein the prisms are made from a resin with a refractive index of Np, and the light-absorbing parts are made from a resin with a refractive index of Nb, and wherein the refractive index Np is equal to or greater than the refractive index Nb.

10. The plasma television according to claim 1, wherein the light-absorbing parts of the optical laminate include light-absorbing particles with a mean particle diameter of 1 μm or more.

11. The plasma television according to claim 1, wherein the layer having a function of shielding electromagnetic waves in the optical laminate has a sheet shaped base and an electrically conductive pattern part formed in a given pattern on one surface of the sheet shaped base.

* * * * *

UNITED STATES PATENT AND TRADEMARK OFFICE
CERTIFICATE OF CORRECTION

| | |
|---|---|
| PATENT NO. | : 8,294,342 B2 |
| APPLICATION NO. | : 12/518133 |
| DATED | : October 23, 2012 |
| INVENTOR(S) | : Tsuyoshi Kashiwagi et al. |

Page 1 of 1

It is certified that error appears in the above-identified patent and that said Letters Patent is hereby corrected as shown below:

<u>Column 1, Line 46</u>

Please delete "the" after --exit towards--.

Signed and Sealed this
Fifth Day of February, 2013

Teresa Stanek Rea
*Acting Director of the United States Patent and Trademark Office*